United States Patent
De las Heras Palmero et al.

(10) Patent No.: US 12,126,211 B2
(45) Date of Patent: Oct. 22, 2024

(54) ELECTRICAL ASSEMBLY

(71) Applicant: Lear Corporation, Southfield, MI (US)

(72) Inventors: Eduardo De las Heras Palmero, Valls (ES); Ignacio Molinero Horno, Valls (ES)

(73) Assignee: Lear Corporation, Southfield, MI (US)

( * ) Notice: Subject to any disclaimer, the term of this patent is extended or adjusted under 35 U.S.C. 154(b) by 166 days.

(21) Appl. No.: 17/554,551

(22) Filed: Dec. 17, 2021

(65) Prior Publication Data
US 2023/0198288 A1   Jun. 22, 2023

(51) Int. Cl.
*H02J 9/06* (2006.01)
*H03K 17/0812* (2006.01)

(52) U.S. Cl.
CPC .......... *H02J 9/061* (2013.01); *H03K 17/0812* (2013.01)

(58) Field of Classification Search
CPC ...... H02J 9/061; H02J 9/04; H02J 9/06; H02J 9/02; H03K 17/041; H03K 17/081; H03K 17/08; H03K 17/0812; H03K 17/08122; H03K 17/0814; H03K 17/08142; H03K 17/082; H03K 17/0822; H03K 17/04106; H03K 17/0416; H03K 17/04163; H03K 17/042
See application file for complete search history.

(56) References Cited

U.S. PATENT DOCUMENTS

| | | | |
|---|---|---|---|
| 6,201,678 B1 | 3/2001 | Kolbas et al. | |
| 6,738,246 B1 | 5/2004 | Strumpler | |
| 10,291,108 B2 | 5/2019 | Ahlers et al. | |
| 2002/0144998 A1* | 10/2002 | Lees | B65B 61/186 220/257.1 |
| 2004/0163858 A1 | 8/2004 | Borrego Bel et al. | |
| 2016/0173094 A1* | 6/2016 | Choi | H03K 19/017518 327/109 |
| 2018/0062384 A1 | 3/2018 | Mothais et al. | |
| 2018/0097390 A1 | 4/2018 | Kube | |
| 2022/0140646 A1* | 5/2022 | Takahashi | H02J 1/084 307/23 |

OTHER PUBLICATIONS

Design publicly available at least as early as Dec. 16, 2020.

* cited by examiner

*Primary Examiner* — Nguyen Tran
(74) *Attorney, Agent, or Firm* — Fishman Stewart PLLC

(57) ABSTRACT

An electrical assembly may include a controller, a first switch electrically connected to the controller, a switch driver electrically connected to the first switch and the controller, and/or a circuit electrically connected to the first switch and the controller. The controller may be configured to control the first switch via the switch driver, and/or the controller may be configured to control the first switch via the circuit. The circuit may include a first resistor and/or a second resistor. A method of operating an electrical assembly may include providing power from a power source to the first switch and/or one or more loads, determining whether a fault condition is present, deactivating the first switch via the controller if the fault condition is present, closing the second switch via the controller, and/or determining, via the circuit, whether the first switch is in an activated state.

20 Claims, 3 Drawing Sheets

ELECTRICAL ASSEMBLY

TECHNICAL FIELD

The present disclosure generally relates to electrical assemblies, including assemblies that may detect and/or protect against certain fault conditions that may, for example, occur in connection with vehicles.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical assemblies do not provide sufficient functionality, are not configured to detect and/or protect against certain fault conditions, and/or require complicated assembly processes.

There is a desire for solutions/options that minimize or eliminate one or more challenges or shortcomings of electrical assemblies. The foregoing discussion is intended only to illustrate examples of the present field and is not a disavowal of scope.

SUMMARY

In embodiments, an electrical assembly may include a controller, a first switch electrically connected to the controller, a switch driver electrically connected to the first switch and the controller, and/or a circuit electrically connected to the first switch and the controller. The controller may be configured to control the first switch via the switch driver, and/or the controller may be configured to control the first switch via the circuit (e.g., in addition to and/or separate from the switch driver). The circuit may include a first resistor and/or a second resistor.

With embodiments, a method of operating an electrical assembly may include providing power from a power source to the first switch and/or one or more loads, determining whether a fault condition is present, deactivating the first switch via the controller if the fault condition is present, closing the second switch via the controller, and/or determining, via the controller and the circuit, whether the first switch is in an activated state.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and embodiments are not restricted to the precise form and configuration shown in the drawings or disclosed in the following detailed description. Exemplary illustrations are described in detail by referring to the drawings as follows:

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
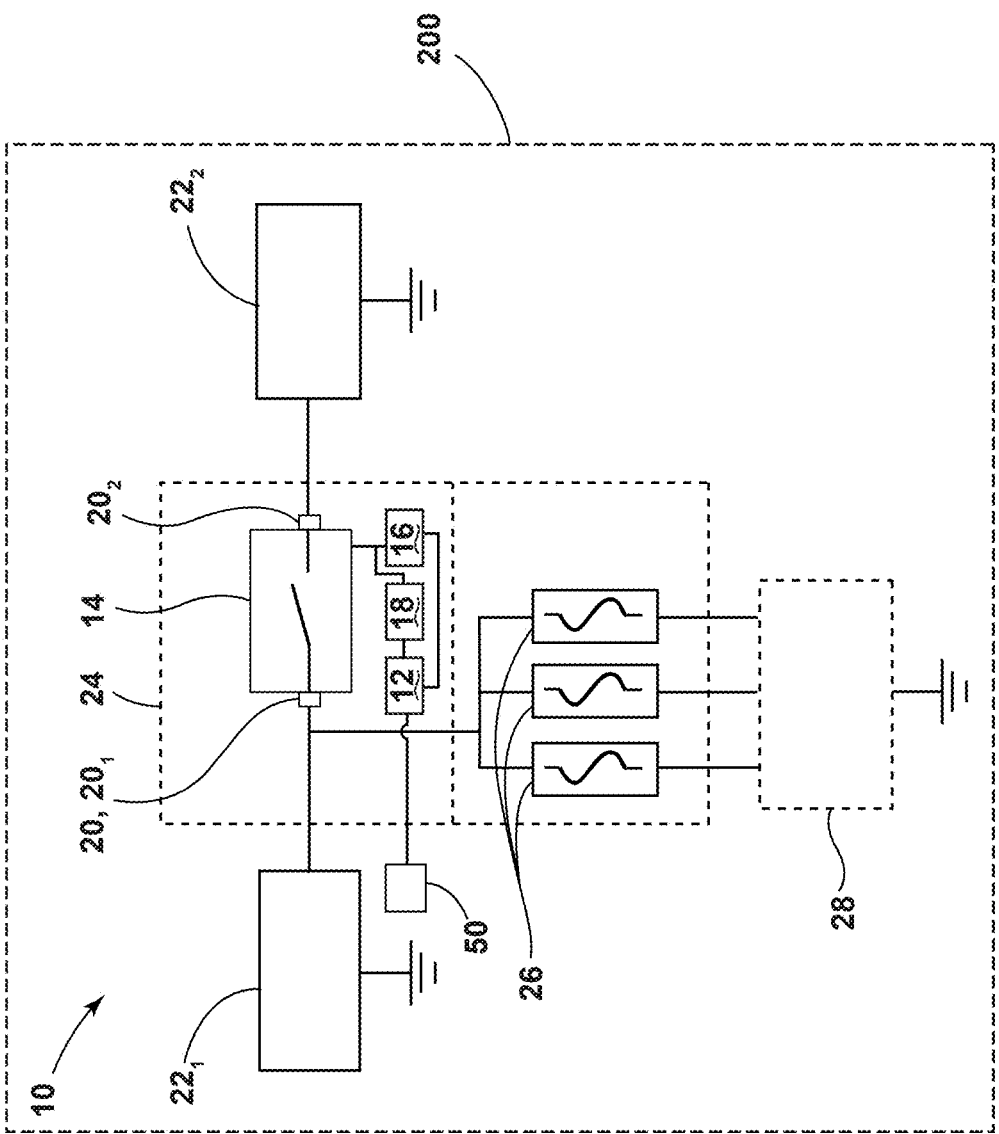
FIG. 1 is a schematic view generally illustrating an embodiment of an electrical assembly.
Figure 2:
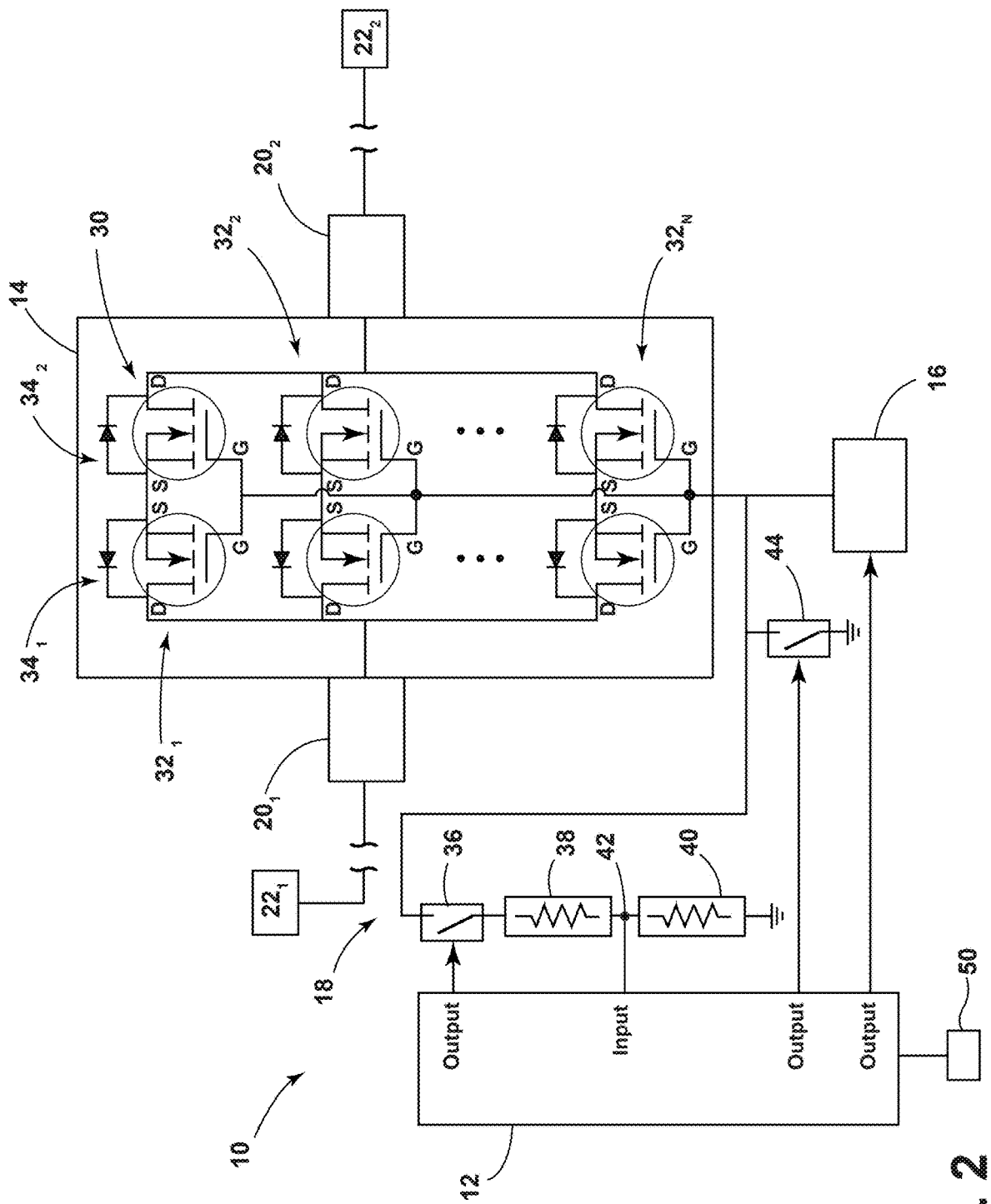
FIG. 2 is a schematic view generally illustrating an embodiment of an electrical assembly.

In embodiments, such as generally illustrated in FIGS. 1 and 2, an electrical assembly 10 may include a controller 12, a first switch 14, a switch driver 16, and/or a circuit 18. The first switch 14 may be electrically connected to the controller 12, such as at least indirectly via the switch driver 16 and/or the circuit 18. The switch driver 16 may be electrically connected to the first switch 14 and/or the controller 12. The circuit 18 may be electrically connected to the first switch 14 and/or the controller 12. In some example configurations, the controller 12 may be configured to control the first switch 14. For example, the controller 12 may be configured to selectively activate/close the first switch 14 to provide current from a power source (e.g., a second power source $22_2$) to one or more loads 28, and the controller 12 may be configured to deactivate/open the first switch 14 to stop providing current from that power source to the one or more loads 28, such as if the current from that power source is not needed or if a fault occurs. In some instances, the controller 12 may be configured to control, at least in part, operation of the first switch 14 via the circuit 18. For example and without limitation, the circuit 18 may be configured to provide a secondary control for disconnecting and/or deactivating the first switch 14, such as in addition to and/or separate from the switch driver 16.

In embodiments, a first switch 14 may include a first terminal $20_1$ and/or a second terminal $20_2$. The first terminal $20_1$ may be electrically connected to a first power source $22_1$, and/or the second terminal $20_2$ may be electrically connected to a second power source $22_2$. In some instances, the first power source $22_1$ may be configured to operate as a primary power source and/or the second power source $22_2$ may be configured to operate as a secondary power source (e.g., backup, supplementary, as needed, etc.). A power source $22_1$, $22_2$ may include one or more of a variety of configurations. For example and without limitation, a power source $22_1$, $22_2$ may include a battery, a capacitor, a solar panel, a power converter, and/or an outlet, among others. In some example configurations, a power source $22_1$, $22_2$ may be configured to provide about 10 V to about 15 V (e.g., about 12 V).

In embodiments, an electrical assembly 10 may include and/or be disposed at least partially within an electrical unit 24 (e.g., a circuit breaker unit, a power distribution unit, etc.). The electrical assembly 10 may include one or a plurality of fuses 26 that may be electrically connected to a first switch 14, a first power source $22_1$, a second power source $22_2$, and/or one or more loads 28. In some example configurations, the electrical assembly 10, the first power source $22_1$, the second power source $22_2$, and/or the electrical unit 24 may be disposed within a vehicle 200 (see e.g., FIG. 1).

In embodiments, a vehicle 200 may include one or more of a variety of configurations. For example and without limitation, a vehicle 200 may include a land vehicle, a passenger car, a van, a sport utility vehicle (SUV), a crossover, a truck (e.g., a pickup truck, a commercial truck, etc.), a bus, a watercraft, an aircraft (e.g., a plane, a helicopter, etc.), and/or a combination thereof (e.g., a vehicle for land and water, a vehicle for air and water, etc.), among others.

In embodiments, a first power source $22_1$ and/or a second power source $22_2$ may be configured to supply power to one or more electrical loads 28. An electrical load 28 may, for example and without limitation, include a single load or a plurality of loads, such as one or more vehicle systems or components (e.g., air conditioner, heater, electric motor, air bag systems, sensors, systems utilizing redundant power supplies, etc.). In some examples, the one or more electrical loads 28 may include electric motors configured to move a vehicle 200 and/or portions thereof (e.g., seats, consoles, etc.).

In embodiments, a first switch 14 may include a relay, an electrical switch, a bi-stable relay, and/or a silicon switch, among others. In some example configurations, the first switch 14 may be configured to selectively permit a first power source $22_1$, a second power source $22_2$, and/or one or more additional power sources to supply power to one or more electrical loads 28. For example, the first switch 14 may include a closed/activated state that permits electrical current to flow from the, the second power source $22_2$ through the first switch 14 and to the one or more loads 28. The first switch 14 may include an open/deactivated state that may prevents electrical current from flowing from the second power source $22_2$ through the first switch 14 and to the one or more loads 28.

In embodiments, such as generally illustrated in FIG. 2, a first switch 14 may include a plurality of transistors 30 that may include respective terminals, inputs, and/or outputs (e.g., gates G, sources S, and drains D in a FET configuration). Control inputs (e.g., gates G) of the plurality of transistors 30 may be electrically connected to a switch driver 16 such that the switch driver 16 may selectively open and close the transistors 30. The plurality of transistors 30 may include a pair of transistors $32_1$ including a first transistor $34_1$ and/or a second transistor $34_2$. The first transistor $34_1$ and/or the second transistor $34_2$ may be disposed in a back-to-back configuration. For example, a source S of the first transistor $34_1$ may be electrically connected to a source S of the second transistor $34_2$.

In embodiments, a plurality of transistors 30 may include one or more additional pairs of transistors $32_{2-N}$. The additional pair of transistors $32_{2-N}$ may be substantially similar to the pair of transistors $32_1$ (e.g., similar transistor arrangement). The pair of transistors $32_1$ and/or the additional pair(s) of transistors $32_{2-N}$ may be disposed in a parallel configuration. In some instances, the plurality of transistors 30 may include a total of ten pairs of transistors $32_N$, but may include other numbers of pairs. The plurality of transistors 30 may include more than or less than ten total pairs of transistors $32_N$.

In embodiments, the transistor(s) 30 may include field effect transistors (FETs), metal oxide semiconductor field effect transistors (MOSFETs), such as n-channel and/or p-channel MOSFETs, and/or bipolar junction transistors (BJTs), among others. The plurality of transistors 30 may or may not include transistors that are all the same (e.g., all MOSFETs, etc.). In some example configurations, the first switch 14 and/or the plurality of transistors 30 may have an electrical current capacity of at least 100 Amps, at least 200 Amps, and/or other greater or lesser values.

In embodiments, a switch driver 16 may be controlled via a controller 12 to activate and/or deactivate a first switch 14. For example, the switch driver 16 may provide a voltage to gates G of a plurality of transistors 30. In some instances, when the voltage supplied to the plurality of transistors 30 is equal to or greater than a predetermined threshold voltage, the plurality of transistors 30 may be in an activated state in which electrical current may be permitted to flow through the plurality of transistors 30. When the voltage supplied to the plurality of transistors 30 is less than the predetermined threshold voltage, the plurality of transistors 30 may be in a deactivated state in which the electrical current may be prevented from flowing through the plurality of transistors 30. In some example configurations, the predetermined threshold voltage may include a voltage that is greater than a voltage of the drains D and/or the sources S of the plurality of transistors 30.

With embodiments, a circuit 18 may include a second switch 36, a first resistor 38, a second resistor 40, and/or a third switch 44 (e.g., a ground switch). The second switch 36 may be electrically connected to a controller 12, the switch driver 16, the first resistor 38, and/or the third switch 44. The controller 12 may be configured to control (e.g., directly via a digital output) the second switch 36. For example, the controller 12 may be configured to selectively open and/or close the second switch 36. The second switch 36 may be connected in series with a first resistor 38 and/or the third switch 44. The first resistor 38 may be connected in series with a second resistor 40. The second resistor 40 may be connected to the controller 12, the first resistor 38, and/or ground (e.g., electrical ground). The first resistor 38 may include a first resistance and the second resistor 40 may include a second resistance. In some configurations, the first resistance may be larger than the second resistance. For example and without limitation, the first resistance may be at least double the second resistance. In one example configuration, the first resistance may be about 100 kilohms and the second resistance may be about 15 kilohms. The ratio of the first resistance to the second resistance may be adjusted according to the switch driver voltage and/or a voltage range of the input (e.g., an analog input) of the controller 12 to which the circuit 18 may be connected.

With embodiments, a first resistor 38 and/or a second resistor 40 may be configured, at least in part, to operate as a voltage divider. A voltage source (e.g., reference voltage) of the voltage divider may include voltage supplied from a switch driver 16 to a first switch 14. An output 42 of the voltage divider may be electrically connected to a controller 12. In some example configurations, the voltage divider may be configured to provide an output voltage to the controller 12 that corresponds to the voltage provided via the switch driver 16 to the first switch 14. If the circuit 18 includes a second switch 36, the circuit 18 may provide the output voltage to the controller 12 when the second switch 36 is closed. In some instances, the controller 12 may be configured to selectively open the second switch 36 to disconnect the voltage divider, such as when monitoring the switch driver output is not desired (e.g., in a sleep/standby mode), which may reduce and/or minimize a current drain.

In embodiments, a third switch 44 may be electrically connected to a controller 12, a switch driver 16, a first switch 14, a second switch 36 and/or a ground. The controller 12 may be configured to selectively open and/or close the third switch 44. For example, the controller 12 be configured to selectively close the third switch 44 to electrically connect the first switch 14 and/or the switch driver 16 to the ground, which may force the first switch 14 into a deactivated state (e.g., open configuration).

In operation, for example and without limitation, an electrical assembly 10 may be configured to detect and/or protect against certain fault conditions. The fault conditions may include, for example, an occurrence of an overcurrent and/or short-circuit, among others. The fault conditions may cause damage (e.g., thermal event) to one or more electrical loads 28 if the fault conditions are not detected and/or protected against. The electrical assembly 10, an electrical unit 24, and/or a vehicle 200 may include one or more electrical components 50, such as various sensors, shunt resistors, among others, that may be configured to detect the fault conditions (e.g., measure electrical current, temperature, etc.).

In embodiments, when a fault condition (e.g., overcurrent) is detected, a controller 12 may be configured to open/deactivate a first switch 14 such that electrical current is prevented from being supplied to one or more electrical loads 28 (e.g., from the second power source $22_2$) and/or damage (e.g., thermal event) to the one or more electrical loads 28 may be avoided. To confirm (e.g., perform diagnostics) that the first switch 14 is open and/or in a deactivated state, the controller 12 may be configured to close a second switch 36. When the second switch 36 is closed, a circuit 18 (e.g., a voltage divider thereof) may be activated and/or configured to provide an output voltage corresponding to the voltage supplied via a switch driver 16 to the first switch 14. The controller 12 may confirm that the first switch 14 is deactivated if the circuit 18 provides an output voltage to the controller 12 that corresponds to a switch driver voltage that is less than a predetermined threshold voltage. If the output voltage is at or above the threshold voltage, the controller 12 may determine that the first switch 14 is still activated/closed.

In embodiments, the controller 12 may be configured to selectively close a third switch 44 if the controller 12 previously attempted to deactivate the first switch 14 via the switch driver 16 but the first switch 14 is in an activated state. When the third switch 44 is closed, the first switch 14 may be connected to a ground, which may shift/force the first switch 14 into a deactivated state and/or limit/avoid damage to one or more electrical loads 28 due to the fault condition. For example and without limitation, connecting the first switch 14 to ground via the third switch 44 may connect the control inputs/gates G of the transistors 30 to ground, which may cause the transistors 30 to open.

In some instances, the switch driver 16, the controller 12, and/or the first switch 14 may experience an error that may prevent the first switch 14 from being deactivated when the controller 12 attempts to open/deactivate the first switch 14. The operation of closing the third switch 44 and forcing the first switch 14 into a deactivated state may be configured to operate as a redundancy (e.g., backup) to the opening of the first switch 14 via the controller 12.

In some configurations, the controller 12 may be configured to control the switch driver 16 according, at least in part, to an output of the circuit 18, the circuit 18 may include a third/ground switch 44, and/or the controller 12 may be configured to open the first switch 14 via closing the third/ground switch 44, such as if the switch driver 16 malfunctions.

Figure 3:
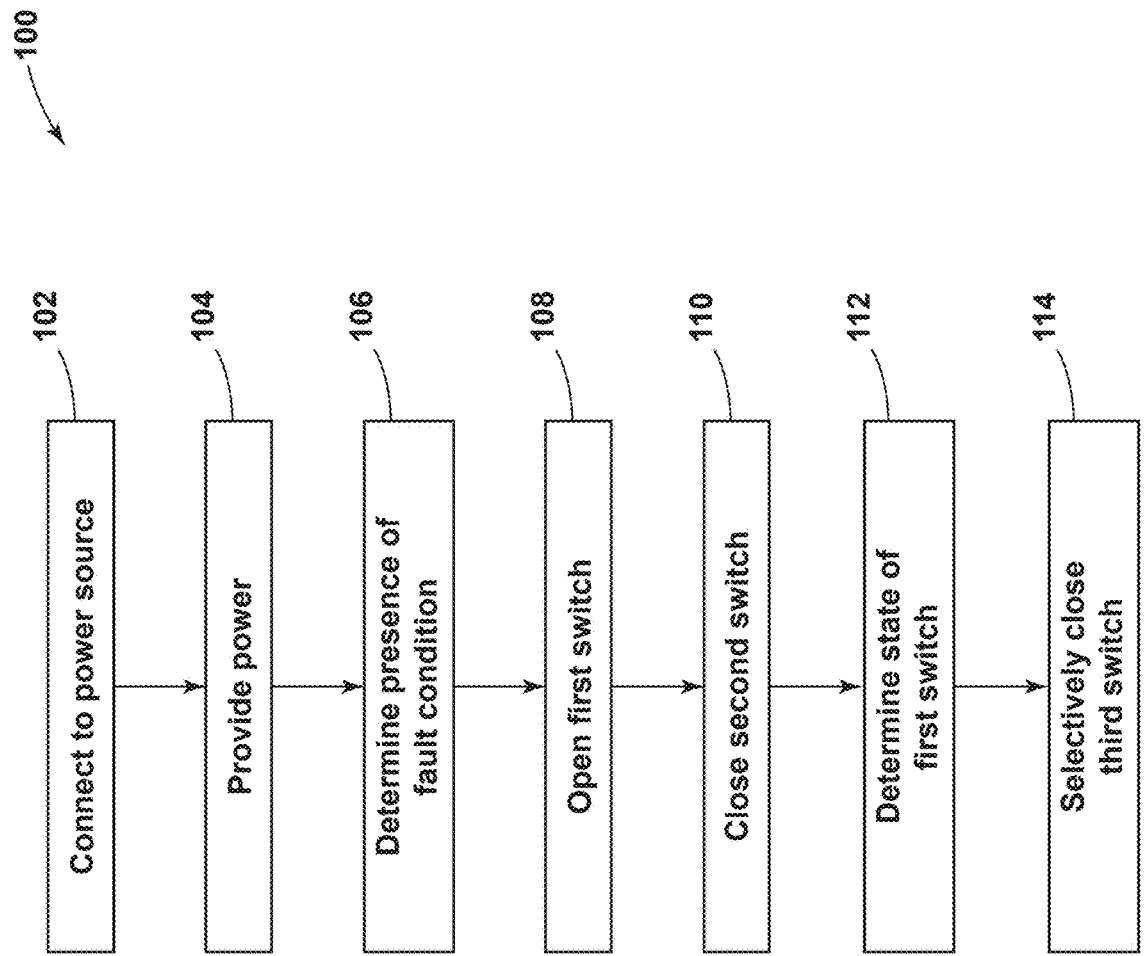
FIG. 3 is a flow diagram generally illustrating an embodiment of a method of operating an electrical assembly.

With embodiments, such as generally illustrated in FIG. 3, a method 100 of operating an electrical assembly 10 may include connecting an electrical assembly 10 and/or a first switch 14 to a power source (block 102). In some configurations, the power source may include a first power source $22_1$, a second power source $22_2$, and/or one or more additional power sources. Connecting an electrical assembly 10 with the power source may include electrically connecting a first switch 14 with the power source.

With embodiments, the method 100 may include providing power from a power source to a first switch 14 and/or to one or more loads 28 (block 104). For example, power (e.g., electrical current) may flow from the power source through the first switch 14 to one or more electrical loads 28.

With embodiments, the method 100 may include determining whether a fault condition is present (block 106). The electrical assembly 10, an electrical unit 24, and/or a vehicle 200 may include electrical components 50, such as various sensors, shunt resistors, among others, that are configured to detect the fault conditions and/or provide information relating to a fault condition to the controller 12.

With embodiments, the method 100 may include deactivating (or attempting to deactivate) a first switch 14 via a controller 12 (block 108), such as if power from a corresponding power source is not needed and/or if a fault condition is present. Deactivating/opening the first switch 14 may, for example, be a first attempt of the electrical assembly 10 to avoid possible damage to one or more electrical loads 28 due to a fault condition.

With embodiments, the method 100 may include closing a second switch 36 via a controller 12 (block 110). The method 100 may include the controller 12 determining a state of the first switch 14 (block 112), such as after a fault condition is detected (e.g., in block 106) and/or after attempting to open the first switch 14 (e.g., in block 108). For example, when the second switch 36 is closed, a circuit 18 may be configured to provide an output to the controller 12 that corresponds to the state of the first switch 14. In some examples, the controller 12 may open the second switch 36 to reduce power consumption when not determining a state of the first switch 14.

With embodiments, the method 100 may include selectively closing a third switch 44 (block 114). The controller 12 may close the third switch 44 if the controller 12 previously attempted to deactivate/open the first switch 14 and the controller 12 determines, via the circuit 18, that the first switch 14 is still in an activated/closed state. When the third switch 44 is closed, the first switch 14 may be forced/shifted into a deactivated state, such as by connecting control inputs/gates G of one or more transistors 30 to electrical ground.

Embodiments of electrical assemblies 10 may provide sensing/diagnostics, redundancy, and/or lower power consumption that other designs do not have, and/or may utilize fewer, smaller, and/or less expensive components compared to other designs.

In examples, a controller (e.g., the controller 12) may include an electronic controller and/or include an electronic processor, such as a programmable microprocessor and/or microcontroller. In embodiments, a controller may include, for example, an application specific integrated circuit (ASIC). A controller may include a central processing unit (CPU), a memory (e.g., a non-transitory computer-readable storage medium), and/or an input/output (I/O) interface. A controller may be configured to perform various functions, including those described in greater detail herein, with appropriate programming instructions and/or code embodied in software, hardware, and/or other medium. In embodiments, a controller may include a plurality of controllers. In embodiments, a controller may be connected to a display, such as a touchscreen display.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples," "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

Joinder references (e.g., attached, coupled, connected, and the like) are to be construed broadly and may include intermediate members between a connection of elements, relative movement between elements, direct connections, indirect connections, fixed connections, movable connections, operative connections, indirect contact, and/or direct contact. As such, joinder references do not necessarily imply that two elements are directly connected/coupled and in fixed relation to each other. Connections of electrical components, if any, may include mechanical connections, electrical connections, wired connections, and/or wireless connections, among others. The use of "e.g." and "such as" in the specification are to be construed broadly and are used to provide non-limiting examples of embodiments of the disclosure, and the disclosure is not limited to such examples or such types of examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer/computing device, an electronic control unit (ECU) a controller, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. An electrical assembly, comprising:
   a controller;
   a first switch connected with a first power source;
   a switch driver electrically connected to the first switch and the controller; and
   a circuit electrically connected to the first switch and the controller, the circuit comprising a second switch connected with a second power source, a ground switch, and a voltage divider;
   wherein the controller is configured to control the first switch via the switch driver; the controller is configured to control the first switch via the circuit; the controller is configured to close the second switch in determining a state of the first switch; the first power source and the second power source are configured to provide power to one or more loads; the controller is configured to attempt to deactivate the first switch if the controller determines that a fault condition is present; and the circuit is configured to determine whether the first switch is in an activated state; and the controller is configured to close the ground switch to connect the first switch and the switch driver to electrical ground.

2. The electrical assembly of claim 1, wherein closing the ground switch induces the first switch to shift to a deactivated state, and the ground switch is electrically connected to the controller, the switch driver, the circuit, the first switch, and electrical ground.

3. An electrical assembly, comprising:
a controller;
a first switch;
a switch driver electrically connected to the first switch and the controller; and
a circuit electrically connected to the first switch and the controller, the circuit comprising a first resistor, a second resistor, and a second switch;
wherein the controller is configured to control the first switch via the switch driver;
the controller is configured to control the first switch via the circuit;
the second switch is connected in series with the first resistor;
the first resistor is connected in series with the second resistor; and
the second resistor is connected to a ground.

4. The electrical assembly of claim 3, wherein the first resistor and the second resistor are configured to operate as a voltage divider; and
an output of the voltage divider is electrically connected to the controller.

5. The electrical assembly of claim 4, wherein the controller is configured to selectively open the second switch to disconnect the voltage divider to minimize a current drain.

6. The electrical assembly of claim 4, wherein the voltage divider is configured to determine a voltage provided via the switch driver to the first switch when the second switch is closed.

7. The electrical assembly of claim 6, wherein the first switch includes an activated state and a deactivated state; and
the first switch is in the deactivated state if the output of the voltage divider is below a threshold voltage.

8. The electrical assembly of claim 3, wherein the circuit includes a third switch electrically connected to the controller, the switch driver, the first switch, the second switch, and an electrical ground.

9. The electrical assembly of claim 8, wherein the controller is configured to selectively close the third switch to electrically connect the first switch to the electrical ground and open the first switch.

10. The electrical assembly of claim 8, wherein the controller is configured to close the third switch if the controller attempted to deactivate the first switch via the switch driver but the first switch is still in an activated state.

11. The electrical assembly of claim 8, wherein the controller is configured to selectively close the third switch to force the first switch into a deactivated state.

12. The electrical assembly of claim 1, wherein the first switch includes a plurality of transistors; and
the first switch has a current capacity of at least 100 A.

13. The electrical assembly of claim 12, wherein the switch driver is electrically connected to control inputs of the plurality of transistors.

14. The electrical assembly of claim 12, wherein the plurality of transistors includes a pair of transistors including a first transistor and a second transistor; and
the first transistor and the second transistor are disposed in a back-to-back configuration.

15. The electrical assembly of claim 14, wherein the plurality of transistors includes a plurality of additional pairs of transistors; and
the pair of transistors and the additional pairs of transistors are connected in a parallel configuration.

16. A vehicle, comprising:
the electrical assembly of claim 3, including:
a first power source electrically connected to the first switch; and
a second power source electrically connected to the first switch;
wherein the first power source and the second power source are configured to provide power to one or more loads; and
the one or more loads include one or more vehicle systems.

17. A method of operating the electrical assembly of claim 3, comprising:
providing power from a power source to the first switch and/or one or more loads;
determining whether a fault condition is present;
attempting to deactivate the first switch via the controller, if the fault condition is present;
closing a second switch via the controller; and
determining, via the circuit, whether the first switch is in an activated state.

18. The method of claim 17, including after attempting to deactivate the first switch via the controller, closing a third switch, if the first switch is determined to be in an activated state;
wherein closing the third switch includes electrically connecting the first switch and the switch driver to electrical ground; and
the third switch is electrically connected to the controller, the switch driver, the circuit, the first switch, and electrical ground.

19. The method of claim 18, wherein closing the third switch includes causing the first switch to shift to a deactivated state.

20. The method of claim 17, including opening the second switch when not determining whether the first switch is in the activated state to reduce power consumption.

* * * * *